(12) United States Patent
Wang et al.

(10) Patent No.: US 12,396,096 B2
(45) Date of Patent: Aug. 19, 2025

(54) CIRCUIT BOARD DEVICE

(71) Applicants: UNIMICRON TECHNOLOGY CORP., Taoyuan (TW); National Taiwan University, Taipei (TW)

(72) Inventors: Chin-Hsun Wang, Taipei (TW); Ruey-Beei Wu, Taipei (TW); Chun-Jui Huang, Taoyuan (TW); Wei-Yu Liao, Taoyuan (TW); Ching-Sheng Chen, Taoyuan (TW); Chi-Min Chang, Taoyuan (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 243 days.

(21) Appl. No.: 18/345,440

(22) Filed: Jun. 30, 2023

(65) Prior Publication Data

US 2024/0397621 A1  Nov. 28, 2024

(30) Foreign Application Priority Data

May 26, 2023 (TW) .................................. 112119769

(51) Int. Cl.
*H05K 1/11* (2006.01)
*H05K 1/02* (2006.01)

(52) U.S. Cl.
CPC ........... *H05K 1/115* (2013.01); *H05K 1/0298* (2013.01); *H05K 1/116* (2013.01); *H05K 1/0251* (2013.01);
(Continued)

(58) Field of Classification Search
CPC ................. H05K 1/115; H05K 1/0298; H05K 2201/0939; H05K 2201/096; H05K 2201/09827; H05K 1/025; H05K 1/0251; H05K 1/111; H05K 2201/09618; H05K 1/0222; H05K 1/0225; H05K 2201/0969; H05K 2201/09718; H05K 2201/09836; H05K 1/181; H05K 3/40; H05K 2201/10189; H05K 2201/093; H05K 1/116; H01P 3/082; H01P 5/085; G02B 6/4279; G02B 6/4284; H01R 12/7076
See application file for complete search history.

(56) References Cited

U.S. PATENT DOCUMENTS 7,492,146 B2 * 2/2009 Behziz .................. H05K 1/116
333/33
10,840,196 B1 * 11/2020 Geyik ............... H01L 23/49838
(Continued)

*Primary Examiner* — Steven T Sawyer
(74) *Attorney, Agent, or Firm* — Birch, Stewart, Kolasch & Birch, LLP

(57) ABSTRACT

A circuit board device includes a transition region that includes a first conductive layer at a first level, a second conductive layer at a second level, and conductive vias. The first conductive layer includes a pad connected to the solderless connector, a transmission line, and a first reference layer. The transmission line includes first and second segments. A second width of the second segment is the same as or less than a first width of the first segment. The first reference layer has a first anti-pad region for the pad and the transmission line disposed therein. In a plan view, the first anti-pad region surrounding the pad is completely located within a second anti-pad region of a second reference layer of the second conductive layer. The conductive vias are disposed between the first and second conductive layers and surround the pad.

20 Claims, 6 Drawing Sheets

(52) U.S. Cl.
CPC ............... *H05K 2201/093* (2013.01); *H05K 2201/0939* (2013.01); *H05K 2201/096* (2013.01); *H05K 2201/09827* (2013.01)

(56) References Cited

U.S. PATENT DOCUMENTS

| | | | | |
|---|---|---|---|---|
| 11,212,910 | B1* | 12/2021 | Lin | H05K 1/116 |
| 2006/0125573 | A1* | 6/2006 | Brunette | H05K 1/0251 |
| | | | | 333/33 |
| 2009/0015345 | A1* | 1/2009 | Kushta | H05K 1/0251 |
| | | | | 333/34 |
| 2010/0065321 | A1* | 3/2010 | Kashiwakura | H05K 1/116 |
| | | | | 29/846 |
| 2012/0325542 | A1* | 12/2012 | Yokoyama | H05K 1/0251 |
| | | | | 174/250 |
| 2020/0006836 | A1* | 1/2020 | Hu | H05K 1/115 |
| 2021/0022240 | A1* | 1/2021 | Lin | H05K 1/0298 |
| 2024/0275014 | A1* | 8/2024 | Tanobe | H01P 5/028 |

* cited by examiner

CIRCUIT BOARD DEVICE

CROSS REFERENCE TO RELATED APPLICATIONS

This application claims priority of Taiwan Patent Application No. 112119769, filed on May 26, 2023, the entirety of which is incorporated by reference herein.

BACKGROUND OF THE INVENTION

Field of the Invention

The present invention relates to a circuit board device, in particular to a circuit board device connected with a solderless connector.

Description of the Related Art

In printed circuit board (PCB) applications, probe testing is used in high-frequency signal measurements. However, probe testing involves a lengthy calibration process, and the probe tips are expensive and fragile. SMA (Sub Miniature version A) connectors are usually used in low-frequency signal measurements. However, it is necessary to solder the SMA connector to the pad of the feed-in point in the circuit for signal measurements. Since the SMA connector needs to be soldered to the circuit, it cannot be reused. On the other hand, connectors that are suitable for high-frequency signal measurements (for example, frequencies up to about 67 GHZ) are relatively expensive, and a large number of measurements will result in higher costs. Even if a solderless connector can be used for signal measurements, the parasitic effect in the feed-in area will cause serious high-frequency reflections. Therefore, it is difficult to perform a Thru-Reflect-Line (TRL) calibration before measurement and further perform an accurate measurement.

BRIEF SUMMARY OF THE INVENTION

An embodiment of the present invention provides a circuit board device. The circuit board device includes a first conductive layer at a first level, a second conductive layer at a second level, and conductive vias. The first conductive layer includes a pad, a transmission line, and a first reference layer. The pad is used to connect to a solderless connector. The transmission line is connected to the pad. The transmission line includes a first segment connected to the pad and a second segment connected to the first segment. The first segment has a first width. The second segment has a second width. The second width is less than or equal to the first width. The first reference layer has a first anti-pad region for the pad and the transmission line disposed therein. The second conductive layer includes a second reference layer. The second reference layer has a second anti-pad region. In a plan view, a portion of the first anti-pad region surrounding the pad is located completely within the second anti-pad region. A first dimension of the second anti-pad region in a first direction is smaller than a second dimension of the second anti-pad region in a second direction. The conductive vias are vertically disposed between the first conductive layer and the second conductive layer. The conductive vias are connected to the first reference layer and the second reference layer and surround the pad.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
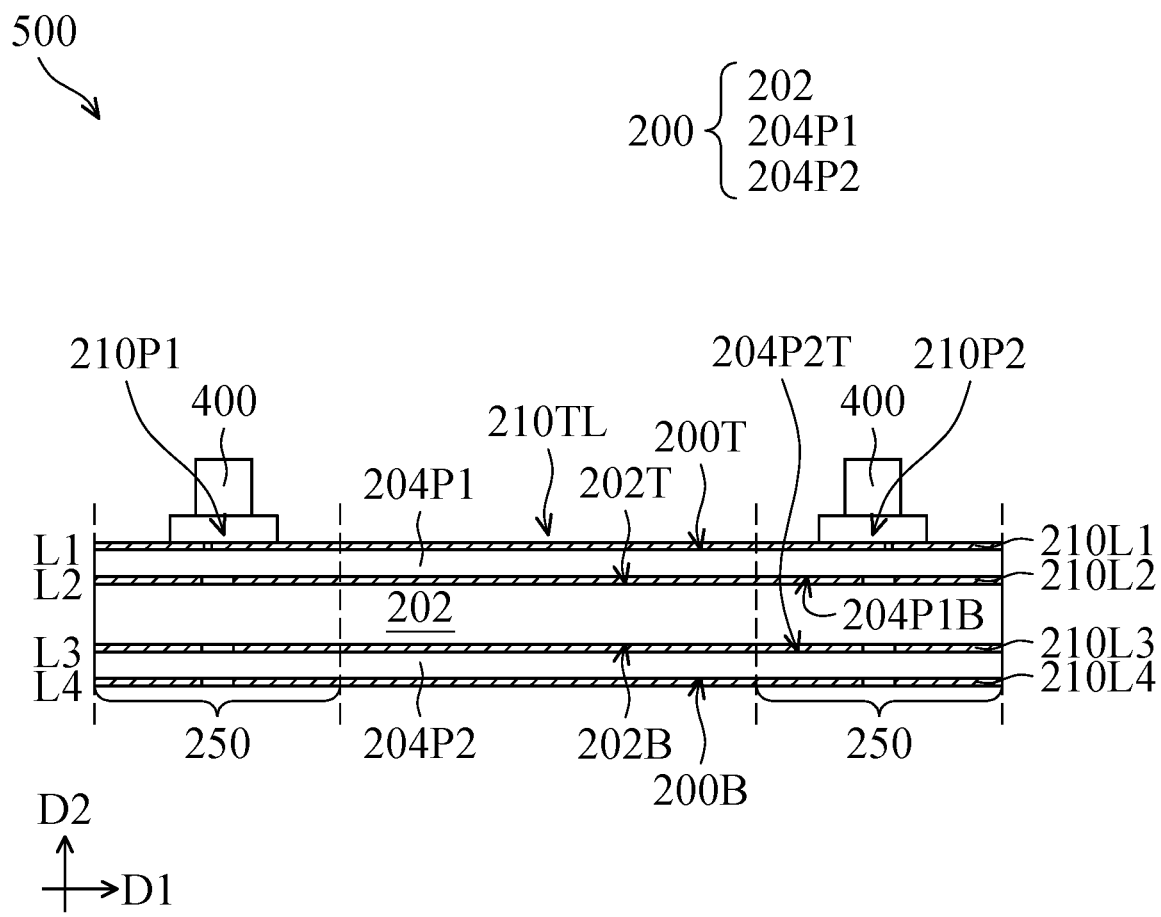
FIG. 1 is a schematic cross-sectional view of a circuit board device in accordance with one embodiment of the disclosure, showing the configuration of the printed circuit board and the connection between the printed circuit board and the solderless connector.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms mentioned herein, such as "upper", "lower", "left", "right" and the like refer to the orientation depicted in the figures. Accordingly, the spatially relative terms are intended to illustrate and are not intended to be limiting.

In some embodiments of the disclosure, the terms such as "dispose", "connect" and the like refer to arrangement and connection, unless otherwise specified, may refer to embodiments in which the two features are in direct contact, and may also refer to embodiments in which additional features may be located between the two features, such that the twos features may not be in direct contact. The terms refer to arrangement and connection may also include the embodiments in which both structures are movable, or both structures are fixed.

In addition, the terms "first", "second" and the like mentioned in this specification or the claims are used to name different features or to distinguish different embodiments or ranges, and are not used to limit the upper limit or lower limit of the number of features, and are also not intended to limit the order of manufacture or arrangement of feature.

The following description is made for the purpose of illustrating the general principles of the invention and should not be taken in a limiting sense. The scope of the invention is best determined by reference to the appended claims.

Figure 2A:
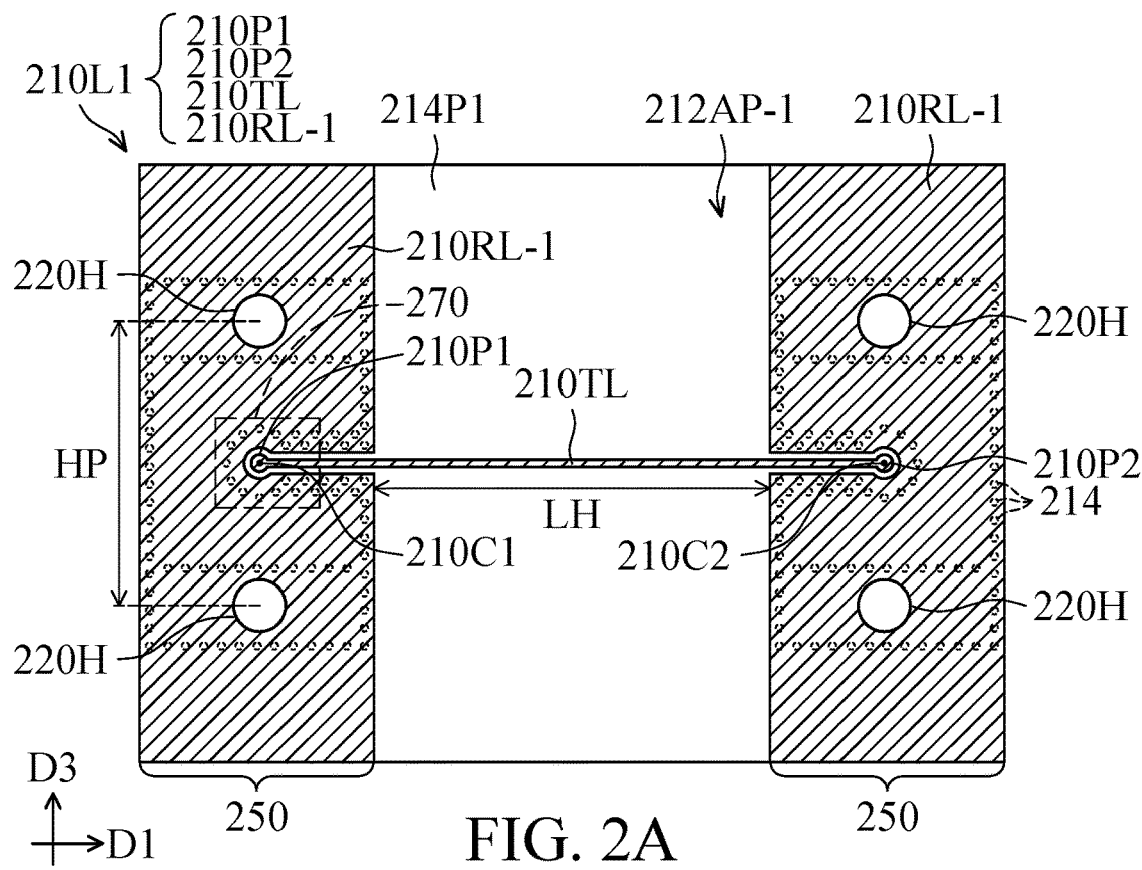
FIG. 2A is a schematic plan view showing a top conductive layer of a transition region of the circuit board device in accordance with one embodiment of the disclosure.
Figure 2B:
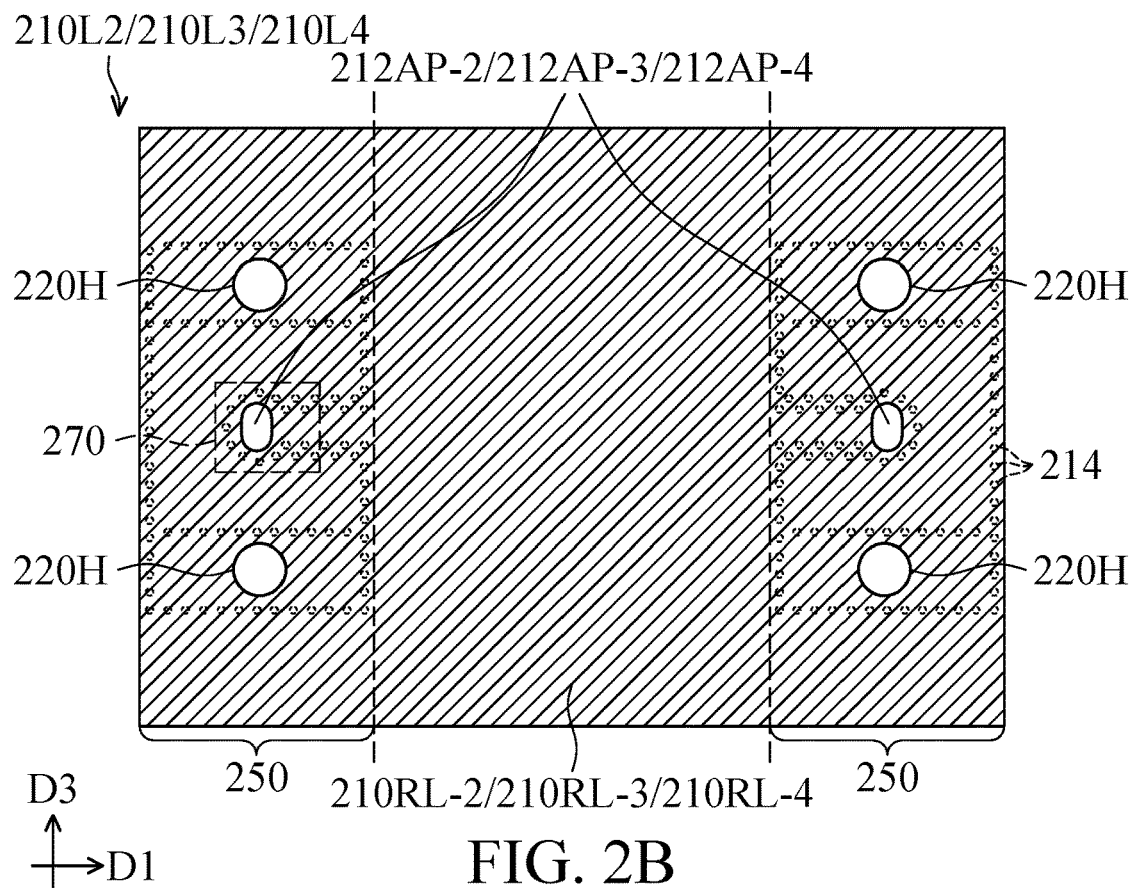
FIG. 2B is a schematic plan view of conductive layers at different levels below the top conductive layer of the transition region of the circuit board device in accordance with one embodiment of the disclosure.

FIG. 1 is a schematic cross-sectional view of a circuit board device 500 in accordance with one embodiment of the disclosure, showing the configuration of the printed circuit board and the connection with the solderless connector. FIG. 2A is a schematic plan view showing a top conductive layer of a transition region 250 of the circuit board device 500 in accordance with one embodiment of the disclosure. FIG. 2B is a schematic plan view of conductive layers at different levels below the top conductive layer of the transition region 250 of the circuit board device 500 in accordance with one embodiment of the disclosure. The circuit board device 500 shown in FIG. 1 only shows some features of the circuit board device 500 for illustration, and remaining features may be shown in the schematic plan views of FIGS. 2A and 2B, and the partially enlarged schematic plan view and the cross-sectional view of FIGS. 3 and 4. In some embodiments, the circuit board device 500 includes a printed circuit board suitable connected to a solderless connector (also called as a solderless coaxial connector or a SMA-like connector) 400, for example, a standard 1.85 mm V-type 50 ohms broadband connector, in order to transmit high-frequency signals (the highest frequency is about 67 GHz). The standard 1.85 mm V-type 50 ohms broadband connector may be, for example, the 1.85 mm solderless surface mount connector produced by Amphenol Corporation. As shown in FIGS. 1, 2A, and 2B, for illustration, the circuit board device 500 is a 4-layer printed circuit board device as an example, in which from the topmost layer to the bottommost layer are respectively marked with a level L1, a level L2, a level L3 and a level L4 in sequence. However, the disclosure may also be applied to other printed circuit board devices with different numbers of layers. Moreover, a first direction D1 labeled in FIGS. 1, 2A and 2B is defined as the horizontal direction (the direction D1 also serves as the extending direction of the conductive lines/transmission lines), and a second direction D2 is defined as the vertical direction (or the extending direction of the conductive pillars). In some embodiments, the circuit board device 500 has a dielectric constant (DK) of about 3.22 and a dissipation factor (DF) of about 0.003. In some embodiments, the circuit board device 500 includes a transition region 250 connected to the solderless connector 400. The transition region 250 is defined as the area between the solderless connector 400 and the transmission line for transmitting signals from the solderless connector 400 to the transmission line through vertical transitions. In some embodiments, the circuit board device 500 includes a substrate 200 and conductive layers 210L1, 210L2, 210L3 and 210L4. The substrate 200 includes a core layer 202 and build-up layers 204P1 and 204P2. The build-up layers 204P1 and 204P2 are respectively disposed on a top surface 202T and a bottom surface 202B of the core layer 202 and completely cover the top surface 202T and the bottom surface 202B. In some embodiments, the core layer 202 and the build-up layers 204P1 and 204P2 may be or include prepreg (PP) containing polymer materials, fiber materials, and other suitable materials. However, the disclosure is not limited to the disclosed embodiments. For example, the polymer material may be or include epoxy resin, polyimide (PI), other suitable polymer materials or a combination thereof. However, the disclosure is not limited to the disclosed embodiments. The fiber material may include carbon fiber, glass fiber, other suitable fiber materials or a combination thereof. However, the disclosure is not limited to the disclosed embodiments. In some embodiments, the thickness of the core layer 202 is in a range of 376 µm to 386 µm, such as about 381 µm. The thickness of the build-up layers 204P1 and 204P2 is in a range of 55 µm to 65 µm, such as about 60 µm.

FIGS. 1, 2A, and 2B, the conductive layer 210L1 at the level L1 is disposed on a top surface 200T of the substrate 200 (also serve as the top surface of the build-up layer 204P1) and in contact with the top surface 200T of the substrate 200. The conductive layer 210L2 is interposed between the build-up layer 204P1 and the core layer 202 along the direction D2 and in contact with a bottom surface 204P1B of the build-up layer 204P1 and the top surface 202T of the core layer 202. The conductive layer 210L3 is interposed between the core layer 202 and the build-up layer 204P2 along direction D2 and in contact with the bottom surface 202B of core layer 202 and a top surface 204P2T of build-up layer 204P2. The conductive layer 210L4 is disposed on a bottom surface 200B of substrate 200 (also can be regarded as the bottom surface of the build-up layer 204P 2) and in contact with the bottom surface 200B of the substrate 200. Therefore, the conductive layers 210L1, 210L2, 210L3, and 210L4 may serve as the top conductive layer 210L1, the middle conductive layers 210L2 and 210L3 and the bottom conductive layer 210L4 of the circuit board device 500, respectively. In some embodiments, the conductive layers 210L1, 210L2, 210L3 and 210L4 include a metal material such as copper. In some embodiments, the thicknesses of the conductive layers 210L1, 210L2, 210L3 and 210L4 are in a range of 13 µm to 23 µm, for example, about 18 µm.

As shown in FIG. 2A, the conductive layer 210L1 located in the transition region 250 includes pads 210P1, 210P2, a transmission line 210TL and a reference layer (also called as a ground layer) 210RL-1.

FIG. 2A, the transmission line 210TL may extend along the direction D1. Two ends of the transmission line 210TL may be respectively connected to the pads 210P1 and 210P2. Therefore, the transmission line 210TL may be respectively connected (electrically connected) to the two solderless connectors 400 disposed on the circuit board device 500 by the pads 210P1 and 210P2. In some embodiments, the transmission line 210TL includes a low-impedance transmission line so that it can provide a more continuous electric field when it is connected to the pads 210P1, 210P2. In some embodiments, the transmission line 210TL includes a microstrip line. In some embodiments, the pads 210P1, 210P2 have the same size and shape in the plan view. For example, the pads 210P1, 210P2 may have a circular shape or other similar shapes. In addition, the pads 210P1, 210P2 may have a geometric center point 210C1, 210C2. The geometric parameters of the transmission line 210TL and the pads 210P1 and 210P2 will be described in detail later.

As shown in FIG. 2A, the disposition (distribution) position of the reference layer 210RL-1 of the conductive layer 210L1 corresponds to the disposition (distribution) position of the solderless connector 400. When the solderless connectors 400 are connected to the pads 210P1 and 210P2 respectively, the projection (vertical projection) of the solderless connectors 400 in the direction D2 (FIG. 1) will be located in the corresponding reference layer 210RL-1. As shown in FIG. 2A, the reference layer 210RL-1 is close to the pads 210P1, 210P2 and end portions of the transmission line 210TL connected to the pads 210P1, 210P2. In some embodiments, the reference layer 210RL-1 has an anti-pad region 212AP-1 (i.e., a hollowed (opening) area of the reference layer 210RL-1) so that the pads 210P1, 210P2 and the transmission line 210TL are disposed therein, and a portion of the build-up layer 204P1 is exposed. In some embodiments, the anti-pad region 212AP-1 close to the end portions of the transmission line 210TL has a shape corresponding to the shape of the pads 210P1, 210P2 and the terminal portions of the transmission line 210TL connected to the pads 210P1, 210P2. In addition, the anti-pad region 212AP-1 close to the end portions of the transmission line 210TL may surround the pads 210P1, 210P2 and the end portions of the transmission line 210TL. In addition, the anti-pad region 212AP-1 close to the middle portion of the transmission line 210TL has a larger area to separate the reference layer 210RL-1 adjacent to the adjacent pads 210P1, 210P2 and both end portions of the transmission line 210TL in to different portions. In some embodiments, the minimum value of a length LH of the middle portion of the transmission line 210TL between the portions of the reference layers 210RL-1 along the direction D1 depends on the size of the solderless connector 400. For example, the length LH may be in a range of 9.5 mm to 10.5 mm, such as about 10 mm, in order to prevent the solderless connectors 400 respectively connected to the pads 210P1 and 210P2 from contacting each other.

As shown in FIG. 2B, compared with the reference layer 210RL-1 shown in FIG. 2A, the reference layers 210RL-2, 210RL-3 and 210RL-4 of the conductive layers 210L2, 210L3 and 210L4 have a larger area in the plan view, so that the projection (vertical projection) of the transmission line 210TL in the direction D2 (FIG. 1) overlaps the reference layers 210RL-2, 210RL-3, and 210RL-4.

As shown in FIG. 2B, in some embodiments, the reference layers 210RL-2, 210RL-3 and 210RL-4 have anti-pad regions 212AP-2, 212AP-3 and 212AP-4, respectively. In the plan view shown in FIG. 2B, the positions of the anti-pad regions 212AP-2, 212AP-3 and 212AP-4 may correspond to the portions of the anti-pad regions 212AP-1 surrounding the pads 210P1 and 210P2, and are surrounded by conductive vias 214. The shapes and geometric parameters of the anti-pad regions 212AP-2, 212AP-3 and 212AP-4 will be described in detail later.

As shown in FIGS. 1, 2A, and 2B, the circuit board device 500 further includes tapped holes 220H passing through the core layer 202, the build-up layers 204P1, 204P2, and the conductive layers 210L1, 210L2, 210L3 and 210L4. The tapped holes 220H may pass through the reference layers 210RL-1, 210RL-2, 210RL-3 and 210RL-4. Moreover, the number and location of the tapped holes 220H correspond to the number and location of the screws of each solderless connector 400, so that the screws (not shown) on the solderless connector 400 may be tightened into the tapped holes 220H to ensure that the pins (not shown) of the solderless connector 400 fit snugly against the corresponding pads 210P1 and 210P2 to ensure a good electrical connection. In some embodiments, a pitch HP corresponding to the tapped holes 220H of the same solderless connector 400 is in a range of 6.66 mm to 7.66 mm, for example about 7.16 mm. In some embodiments, the diameter of the tapped hole 220H may be 0.1 mm to 0.2 mm larger than the diameter of the screw on the solderless connector 400, so as to facilitate the screw to be tightened into the tapped hole 220H.

Figure 4:
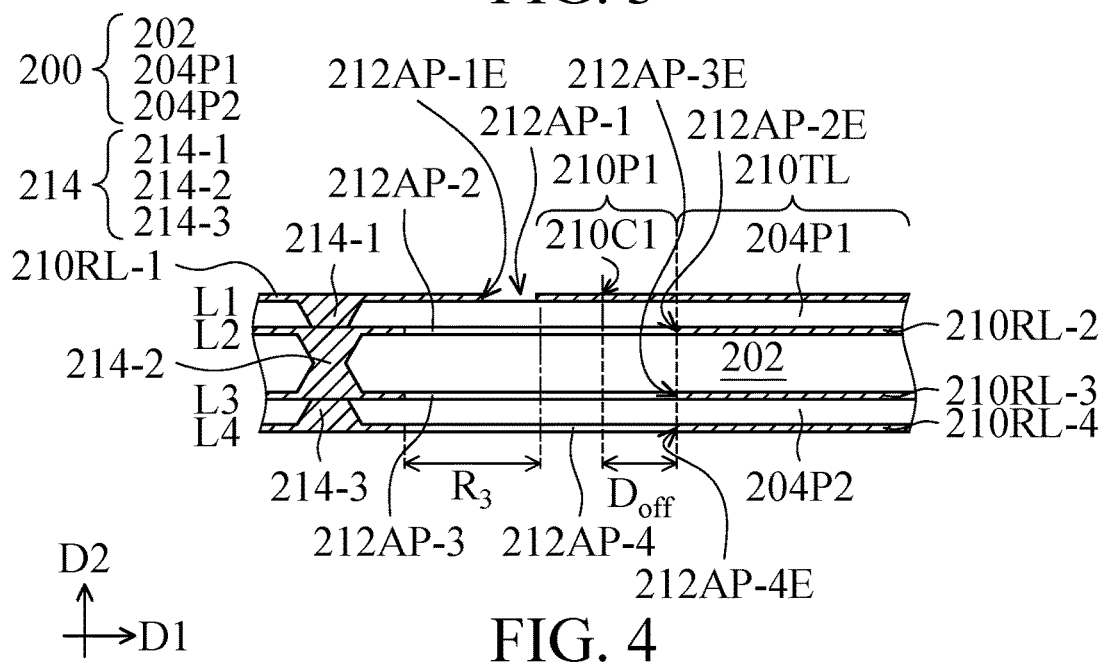
FIG. 4 is a schematic cross-sectional view along line A-A' of FIG. 3, showing the arrangement of various conductive layers in the transition region of the circuit board device in accordance with one embodiment of the disclosure.

As shown in FIGS. 1, 2A, and 2B, the circuit board device 500 further includes conductive vias 214 disposed in the core layer 202, the build-up layers 204P1, 204P2, and the conductive layers 210L1, 210L2, 210L3, and 210L4 along the direction D2 (FIG. 1). The conductive vias 214 arranged at intervals surround the tapped holes 220H. In addition, the conductive vias 214 surround a portion of the anti-pad region 212AP-1 close to the end portions of the transmission line 210TL and the pads 210P1 and 210P2. Furthermore, the conductive vias 214 may be arranged corresponding to the edges of the projection (vertical projection) of the solderless connector 400 in the direction D2 (FIG. 1). In some embodiments, the conductive vias 214 are vertically disposed between the reference layers 210RL-2, 210RL-3, 210RL-4 and are electrically connected to the reference layers 210RL-2, 210RL-3, 210RL-4 (FIG. 4). In some embodiments, the conductive vias 214 serve as ground vias (gnd vias).

Figure 3:
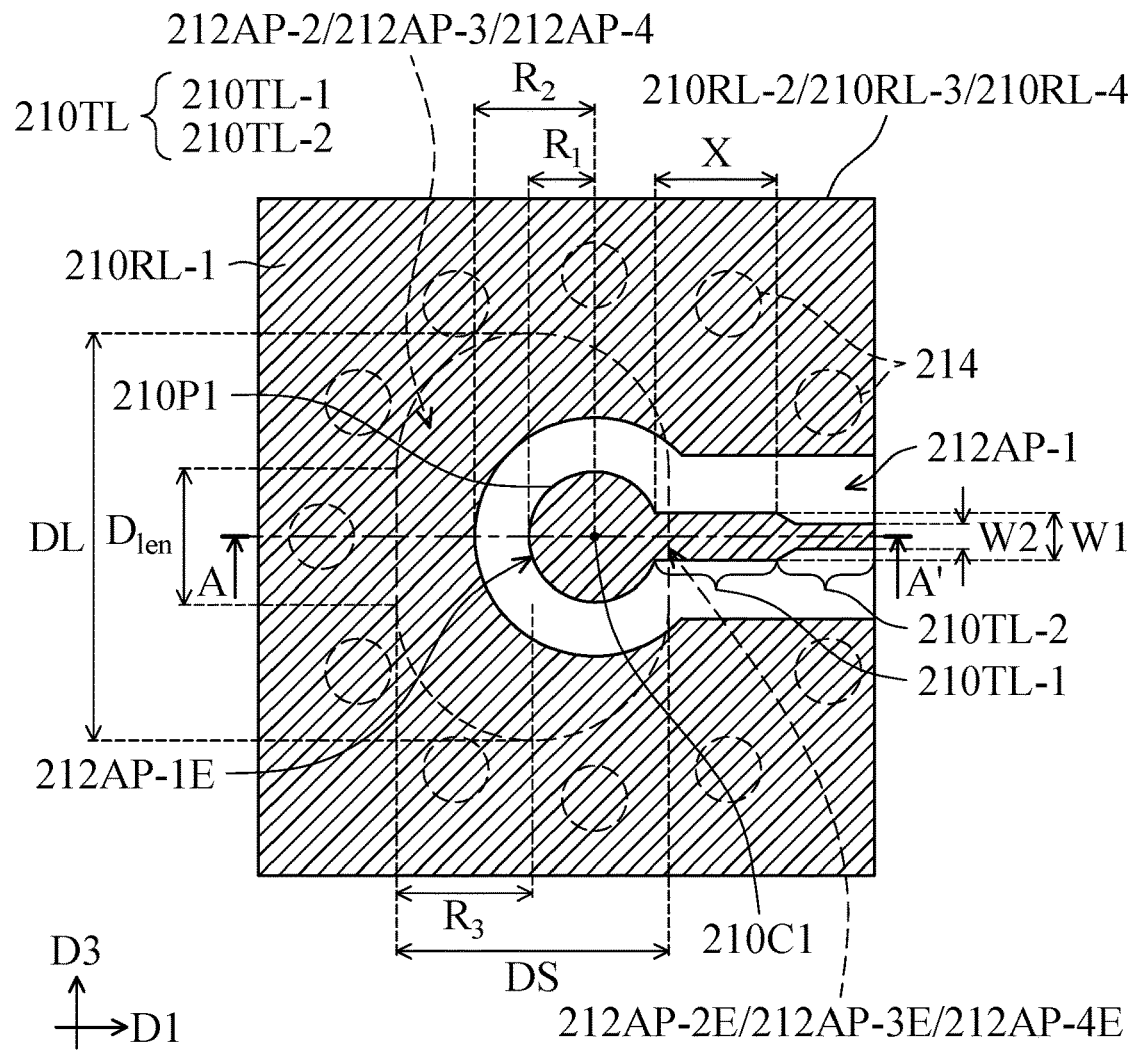
FIG. 3 is a partially enlarged view of FIGS. 2A and 2B, showing a schematic plan view of the transition region of the circuit board device in accordance with one embodiment of the disclosure.

FIGS. 3 and 4 are used to illustrate the configuration and geometric parameters of the pads 210P1, 210P2, the transmission line 210TL and the anti-pad regions 212AP-1, 212AP-2, 212AP-3, 212AP at the levels L1, L2, L3 and LA of the transition region 250 of the circuit board device 500. FIG. 3 is a partially enlarged view of FIGS. 2A and 2B, showing a schematic plan view an region 270 of the transition region 250 of the circuit board device in accordance with one embodiment of the disclosure. FIG. 4 is a schematic cross-sectional view along line A-A' of FIG. 3, showing the arrangement of various conductive layers in the transition region 250 of the circuit board device 500 in accordance with one embodiment of the disclosure. For illustration, FIGS. 3 and 4 show a portion of the transition region 250 corresponding to the pad 210P1. The plan view and cross-sectional schematic view of another portion of the transition region 250 corresponding to the pad 210P2 have configurations and geometric parameters that are left-right symmetrical to those described in FIGS. 3 and 4 and the details are not repeated herein.

As shown in FIGS. 3 and 4, the pad 210P1 may have a radius R1 (i.e., the distance between the geometric center point 210C1 of the pad 210P1 and the edge of the pad 210P1). The minimum value of the radius R1 of the pad 210P1 may be selected according to the process limitations and electrical analysis results. In some embodiments, the minimum value of the radius R1 is greater than or equal to 195 μm. In addition, the minimum value of the radius R1 is in a range of 195 μm to 205 μm, for example, the minimum value of the radius R1 is about 200 μm to reduce the impedance discontinuity between the pad 210P1 and the transmission line 210TL.

The geometric center point of the portion of the anti-pad region 212AP-1 surrounding the pad 210P1 may overlap the geometric center point 210C1 of the pad 210P1. In addition, the portion of the anti-pad region 212AP-1 surrounding the pad 210P1 may have a radius R2 (i.e., the distance between the geometric center point 210C1 of the pad 210P1 and an edge 212AP-1E of the anti-pad region 212AP-1 surrounding the pad 210P1). In some embodiments, radius R2 is greater than radius R1. If the radius R2 of the anti-pad region 212AP-1 is increased, the equivalent parasitic capacitance between the pad 210P1 and the anti-pad region 212AP-1 is decreased, but the signal return path under the transmission line 210TL is also decreased and the equivalent inductance of the transmission line 210TL is increased significantly. If the radius R2 of the anti-pad region 212AP-1 is decreased, the inductive discontinuity of the transmission line 210TL will be decreased, but the capacitive discontinuity between the pad 210P1 and the anti-pad region 212AP-1 will be increased. The radius R2 of the anti-pad region 212AP-1 surrounding the pad 210P1 may be selected according to the process limitations and electrical analysis results. In some embodiments, the radius R2 is in a range of 445 μm to 455 μm, for example, about 450 μm.

In some embodiments, the segment connecting the transmission line 210TL to the pad 210P1 may have a specific range in width and length according to the process limitations and electrical analysis results, so that the width of the transmission line 210TL gradually increases from the central portion to the end portion, improving the impedance matching (impedance continuity) between the transmission line 210TL and the pad 210P1. As shown in FIGS. 3 and 4, the transmission line 210TL may include a segment 210TL-1 (also called as a compensation segment 210TL-1, which includes the central portion of the transmission line 210TL in FIG. 2A between the reference layers 210RL-1) and a segment 210TL-2 connected to the segment 210TL-1 (also called as a transmission segment 210TL-2). The segment 210TL-1 may have a length X and a width W1, and the segment 210TL-2 may have a width W2. In some embodiments, the width W2 of the segment 210TL-2 is less than or equal to the width W1 of the segment 210TL-1.

The length X and the width W1 of the segment 210TL-1 may be selected according to the process limitations and electrical analysis results. In some embodiments, the length X of the segment 210TL-1 is in a range of 95 μm to 605 μm, for example, in a range of 100 μm to 600 μm. In some embodiments, the length X of the segment 210TL-1 may be in a range of 325 μm to 605 μm, for example, may be in a range of 330 μm to 600 μm.

In some embodiments, the width W1 of the segment 210TL-1 is in a range of 145 μm to 215 μm, such as in a range of 150 μm to 210 μm. In some embodiments, the width W1 of the segment 210TL-1 is in a range of 165 μm to 195 μm, such as in a range of 170 μm to 190 μm.

The width W2 and the impedance of the segment 210TL-2 may be selected according to the process limitations and electrical analysis results. In some embodiments, the width W2 of the segment 210TL-2 is in a range of 125 μm to 135 μm, such as about 130 μm. In some embodiments, the impedance of the segment 210TL-2 is in a range of 45 ohms to 55 ohms, for example, about 50 ohms.

As shown in FIGS. 3 and 4, the anti-pad regions 212AP-2, 212AP-3 and 212AP-4 of the reference layers 210RL-2, 210RL-3 and 210RL-4 correspond to the pad 210P1 are disposed directly below the pad 210P1 and the portion of the anti-pad region 212AP-1 surrounding the pad 210P1. Moreover, the conductive vias 214 corresponding to the pads 210P1 (including conductive vias 214-1 vertically arranged between the reference layers 210RL-1 and 210RL-2, conductive vias 214-2 vertically arranged between the reference layers 210RL-2 and 210RL-3 and conductive vias 214-3 vertically disposed between the reference layers 210RL-3 and 210RL-4) surround the anti-pad regions 212AP-2, 212AP-3 and 212AP-4. In the plan view shown in FIG. 3, the reference layers 210RL-2, 210RL-3 and 210RL-4 do not overlap the pad 210P1 at all. Moreover, the conductive vias 214 do not overlap the anti-pad regions 212AP-1, 212AP-2, 212AP-3 and 212AP-4 at all.

In some embodiments, the area of the anti-pad regions 212AP-2, 212AP-3, 212AP-4 surrounded by the conductive vias 214 in the plan view may be maximized, and the overlapping area of the anti-pad regions 212AP-2, 212AP-3, 212AP-4 and the transmission line 210TL in the direction D2 (FIG. 1) may be optimized to improve the impedance continuity of the transmission line 210TL and reduce the return loss of the transmission line 210TL. As shown in FIG. 4, in some embodiments, the area of the anti-pad regions 212AP-2, 212AP-3, and 212AP-4 in the plan view is larger than the portion of the anti-pad region 212AP-1 surrounding the pad 210P1, so that the vertical projection of portion of the anti-pad region 212AP-1 surrounding the pad 210P1 in the direction D2 (FIG. 1) is completely located within the anti-pad regions 212AP-2, 212AP-3 and 212AP-4. In some embodiments, edge portions 212AP-2E, 212AP-3E and 212AP-4E of the anti-pad regions 212AP-2, 212AP-3 and 212AP-4 below the transmission line 210TL and the geometric center point 210C1 of the pad 210P1 are separated by a distance $D_{off}$. The distance $D_{off}$ may be selected according to the process limitations and electrical analysis results. In some embodiments, the distance $D_{off}$ is in a range of 220 μm to 355 μm, for example, may be in a range of 225 μm to 350 μm.

As shown in FIG. 3, in some embodiments, the shape of the anti-pad regions 212AP-2, 212AP-3 and 212AP-4 in the plan view may include a capsule shape. However, the disclosure is not limited to the disclosed embodiments. In the embodiment in which the shape of the anti-pad regions 212AP-2, 212AP-3 and 212AP-4 in the plan view is a capsule shape, a dimension DS of the anti-pad regions 212AP-2, 212AP-3 and 212AP-4 in the direction D1 (substantially parallel to the extending direction of the transmission line 210TL) is less than a dimension DL of the anti-pad regions 212AP-2, 212AP-3 and 212AP-4 in the direction D3 (substantially perpendicular to the extending direction of the transmission line 210TL). The two arc-shaped ends of each capsule-shaped anti-pad regions 212AP-2, 212AP-3 and 212AP-4 along the direction D3 may have a radius R3. In addition, a portion of each of the anti-pad regions 212AP-2, 212AP-3 and 212AP-4 located between the two arc ends along the direction D3 may have an extended length $D_{len}$. In some embodiments, the dimension DS of the anti-pad regions 212AP-2, 212AP-3 and 212AP-4 may be equal to twice the radius R3. The dimension DL of the anti-pad regions 212AP-2, 212AP-3 and 212AP-4 may be equal to the sum of the extension length $D_{len}$ and twice the radius R3. The ranges of radius R3 and the extension length $D_{len}$ may be selected according to the process limitations and electrical analysis results. In some embodiments, the radius R3 is in a range of 395 μm to 405 μm, for example, about 400 μm. In some embodiments, the extension length $D_{len}$ is in a range of 395 μm to 405 μm, for example, about 400 μm.

In some embodiments, the shapes of the anti-pad regions 212AP-2, 212AP-3 and 212AP-4 in the plan view may include a semicircle shape (in which the diameter portions of the semicircle anti-pad regions 212AP-2, 212AP-3 and 212AP-4 overlap the transmission line 210TL), a crescent shape (in which the chord portion of crescent anti-pad regions 212AP-2, 212AP-3 and 212AP-4 overlap the transmission line 210TL), a kidney shape (in which the concave portion of the kidney-shaped anti-pad regions 212AP-2, 212AP-3 and 212AP-4 overlap the transmission line 210TL), or another suitable shape. In some embodiments, the anti-pad regions 212AP-2, 212AP-3 and 212AP-4 have the same area in the plan view and completely overlap one another in the direction D2 (FIG. 1). In some embodiments, the anti-pad regions 212AP-2, 212AP-3 and 212AP-4 may have different areas in the plan view and/or partially overlap one another in the direction D2 (FIG. 1).

In some embodiments, the geometric parameters of the transition region 250 of the circuit board device 500, including the length X and the width W1 of the segment 210TL-1 of the transmission line 210TL-1, and the distance $D_{off}$ between the anti-pad regions 212AP-2, 212AP-3, 212AP-4 and the geometric center point 210C1 of the pad 210P1, may be optimized using an artificial neural network (ANN) model to determine the relationship between the geometric parameters (the input parameters) and the reflection coefficient ($S_{11}$) (the output parameter). The input/output parameters may determine the optimal structural design of the transition region 250 of the circuit board device 500 suitable for low-cost solderless connectors in high-frequency signal measurement (for example, the highest frequency is about 67 GHZ).

TABLE 1

| | Inputs | | |
|---|---|---|---|
| Geometric parameters | Width W1(μm) | Length X (μm) | Distance $D_{off}$(μm) |
| Range | 150~210 | 100~600 | 225~350 |

Table 1 shows the ranges for the input geometric parameters (the input parameters) for the artificial neural network model. The input geometric parameters for the artificial neural network model include the length X and width W1 of the segment 210TL-1 of the transmission line 210TL, and the distance $D_{off}$ between the anti-pad regions 212AP-2, 212AP-3, 212AP-4 and the geometric center point 210C1 of the pad 210P1. The output parameter is the maximum value of the reflection coefficient (Max_$S_{11}$ (dB)) in the frequency band of 1 GHz to 70 GHz. In addition, other geometric parameters of the transition region 250 of the circuit board device 500 may be respectively determined according to the process limitations and electrical analysis results. For example, the radius R1 is about 200 μm, the radius R2 is about 450 μm, the radius R3 is about 400 μm, and the extension length $D_{len}$ is about 400 μm. The width W2 of the segment 210TL-2 is about 130 μm. The impedance of the segment 210TL-2 is about 50 ohms.

Figure 5:
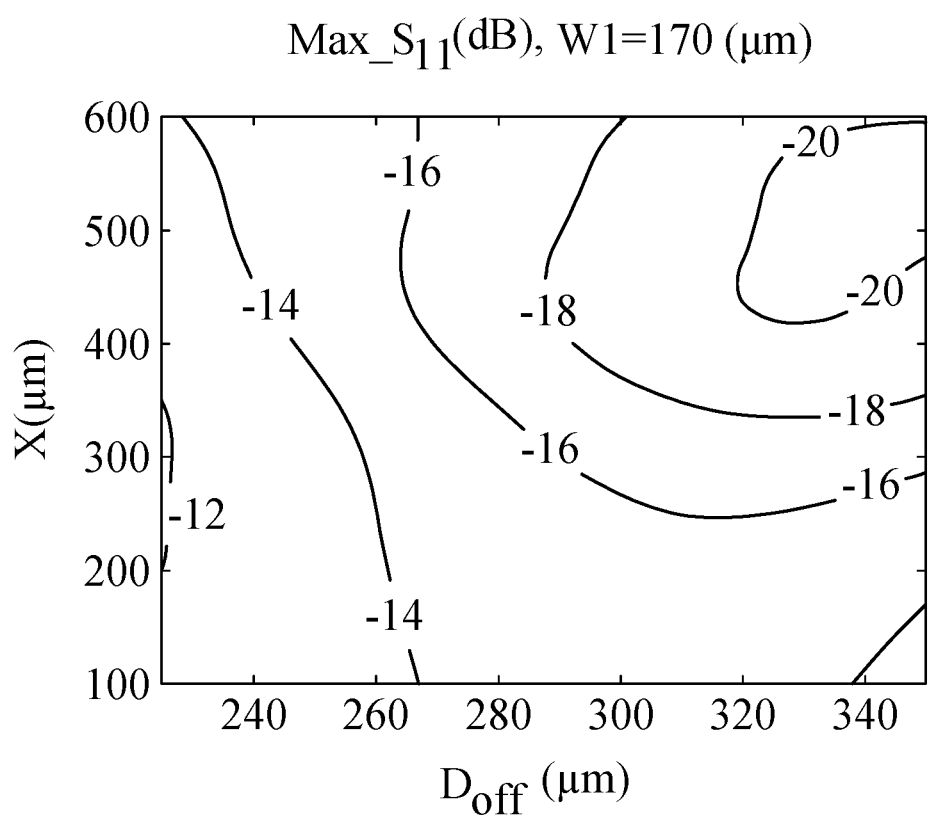
FIGS. 5 and 6 are diagrams of the relationship between the geometric parameters and the reflection coefficient ($S_{11}$ (dB)) of the transition region of the circuit board device in accordance with one embodiment of the disclosure.
Figure 6:
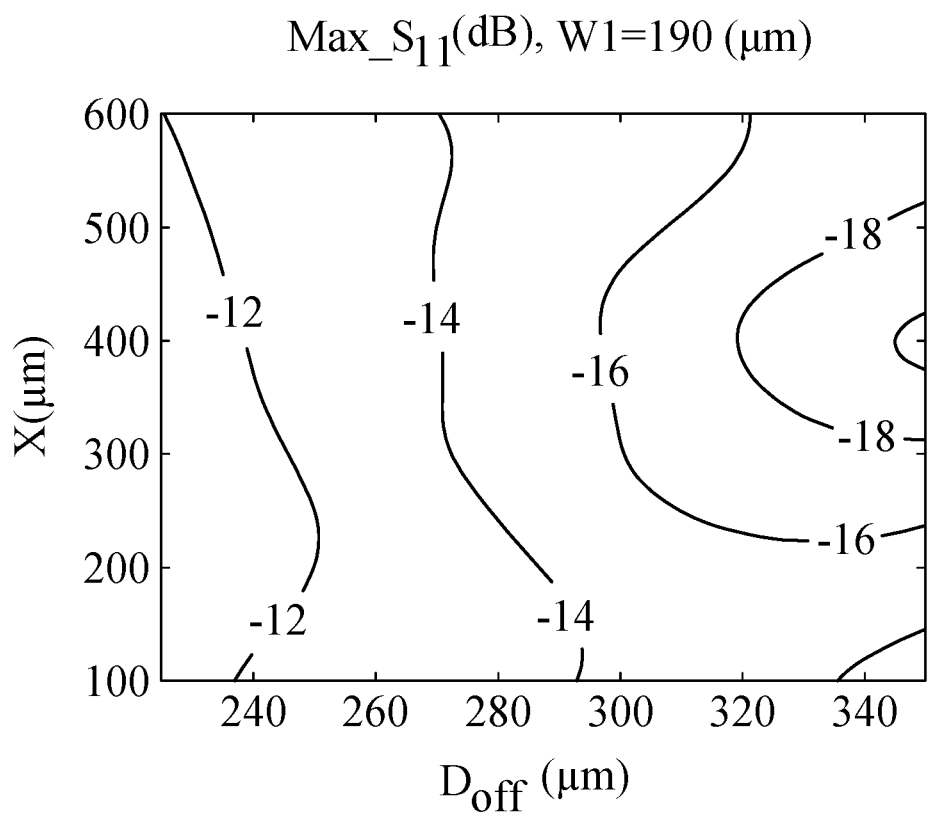

FIGS. 5 and 6 are diagrams of the relationship between the geometric parameters and the reflection coefficient ($S_{11}$ (dB)) of the transition region 250 of the circuit board device 500 in accordance with one embodiment of the disclosure. The output reflection coefficient ($S_{11}$ (dB)) is obtained using the artificial neural network model and according to the input geometric parameters in Table 1.

FIG. 5 is a contour map of the maximum reflection coefficient (Max_$S_{11}$) of the transition region 250, wherein the contour line of the maximum reflection coefficient (Max_$S_{11}$) is obtained when the width W1 of the segment 210TL-1 of the transmission line 210TL is about 170 μm, the length X of the segment 210TL-1 is in a range of 100 μm to 600 μm, and the distance $D_{off}$ between the anti-pad regions 212AP-2, 212AP-3, 212AP-4 and the geometric center point 210C1 of the pad 210P1 (and the geometric center point 210C2 of the pad 210P2) is in a range of 225 μm to 350 μm. In FIG. 5, the number marked on each contour line is the maximum value of the reflection coefficient of the above contour line. As shown in FIG. 5, when the width W1 of the segment 210TL-1 is about 170 μm, the maximum value of the reflection coefficient corresponding to the above ranges of length X and distance $D_{off}$ is less than about −10 dB, but not to exceed about −20.8 dB. When the length X is about 550 μm and the distance $D_{off}$ is about 350 μm, the reflection coefficient maximum value has an optimum value of about −20.8 dB.

FIG. 6 is a contour map of the maximum reflection coefficient (Max_$S_{11}$) of the transition region 250, wherein the contour line of the maximum reflection coefficient (Max_$S_{11}$) is obtained when the width W1 of the segment 210TL-1 of the transmission line 210TL is about 190 μm, the length X of the segment 210TL-1 is in a range of 100 μm to 600 μm, and the distance $D_{off}$ between the anti-pad regions 212AP-2, 212AP-3, 212AP-4 and the geometric center point 210C1 of the pad 210P1 (and the geometric center point 210C2 of the pad 210P2) is in a range of 225 μm to 350 μm. In FIG. 6, the number marked on each contour line is the maximum value of the reflection coefficient of the above contour line. As shown in FIG. 6, when the width W1 of the segment 210TL-1 is about 190 μm, the maximum value of the reflection coefficient corresponding to the ranges of the length X and the distance $D_{off}$ are less than −10 dB, but do not exceed about −20.2 dB. When the length X is about 400 μm and the distance $D_{off}$ is about 350 μm, the maximum value of the reflection coefficient has an optimal value of about −20.2 dB.

TABLE 2

| Input geometric parameters | | | Output parameter Maximum reflection |
|---|---|---|---|
| Width W1(μm) | Length X (μm) | Distance $D_{off}$(μm) | coefficient (Max_$S_{11}$ (dB)) |
| 150 | 600 | 225 | −18.8 |
| 170 | 550 | 350 | −20.8 |
| 190 | 400 | 350 | −20.2 |
| 210 | 330 | 350 | −17.7 |

Table 2 shows the relationship between the output parameter (the maximum reflection coefficient (Max_$S_{11}$ (dB)) and the input geometric parameters (including the length X and the width W1 of the segment 210TL-1 of the transmission line 210TL, and the distance $D_{off}$ between the anti-pad region 212AP-2, 212AP-3, 212AP-4 and the geometric center point 210C1 of the pad 210P1) for the artificial neural network model. Table 2 also shows the optimal values of the maximum reflection coefficient (Max_$S_{11}$ (dB)) of the segment 210TL-1 of the transmission line 210TL corresponding to several specific widths W1. In some embodiments, the transition region 250 of the circuit board device 500 may be optimized according to the optimal value of the geometric parameters in Table 2 to improve the reflection coefficient at high frequencies and increase the applicable bandwidth of the circuit board device 500.

Figure 7:
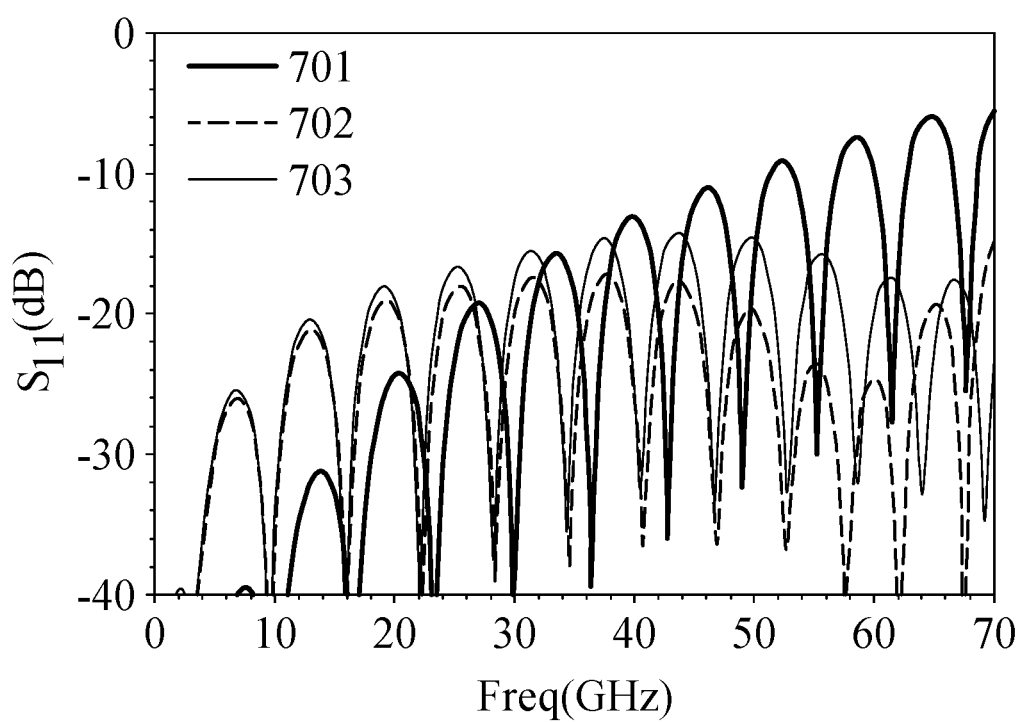
FIG. 7 is a diagram showing the comparison of reflection coefficients versus signal frequency between the transition region of the circuit board device in accordance with one embodiment of the disclosure and the transition region of a conventional printed circuit board.

FIG. 7 is a diagram showing the comparison of reflection coefficients ($S_{11}$ (dB)) versus signal frequency (Freq (GHz)) between the transition region 250 of the circuit board device 500 in accordance with one embodiment of the disclosure and the transition region of the conventional printed circuit board, in which the transition region 250 of the circuit board device 500 in accordance with one embodiment of the disclosure and the transition region of the conventional printed circuit board are connected to solderless connectors. The difference between the transition region of the conventional printed circuit board and the transition region 250 in accordance with one embodiment of the disclosure is that the anti-pad regions at the levels L2 to L4 are all circular shape and completely overlap the anti-pad region at the level L1 and surrounding the pad in a plan view in the transition region of the conventional printed circuit board. In addition, the conventional anti-pad regions at the levels L1 to L4 have the same size (for example, twice the radius R2) in directions substantially parallel to and perpendicular to the extension direction of the transmission line (i.e., the directions D1 and D3). The curve 701 shows the characteristic curve of the reflection coefficient of the transition region of the conventional printed circuit board versus the signal frequency. The curve 702 shows the characteristic curve of the reflection coefficient of the transition region 250 of the circuit board device 500 versus to the signal frequency, in which the geometric parameters of the transition region 250 of the circuit board device 500 may be designed according to the optimal length X and distance $D_{off}$ corresponding to the width W1 of 170 μm in Table 2. The curve 703 shows the characteristic curve of the reflection coefficient of the transition region 250 of the circuit board device 500 versus to the signal frequency, in which the geometric parameters of the transition region 250 of the circuit board device 500 may be designed according to the optimal length X and distance $D_{off}$ corresponding to the width W1 of 190 μm in Table 2. The curve 701 shows that when the transition region of the conventional printed circuit board is connected to the solderless connector, the reflection coefficient increases as the signal frequency increases due to the parasitic effect of the feed-in area, and the serious signal reflection problems may occur at high frequencies (about 67 GHz). Therefore, it is difficult to perform a Thru-Reflect-Line (TRL) calibration before measurement and further perform an accurate measurement. The curves 701, 702 and 703 show that the reflection coefficient of the transition region 250 of the circuit board device 500 with optimized geometric parameters is less than −15 dB for the signal frequency of 1 GHz to 70 GHz. The reflection coefficient of the transition region 250 of the circuit board device 500 (the curves 701, 702 and 703) at high frequency (about 67 GHZ) may be 10 dB lower than the transition region of the conventional printed circuit board (the curve 701). Therefore, the measured return loss of the transition region at high frequencies (about 67 GHz) can be improved.

Embodiments provide a circuit board device suitable for connection with a solderless connector, which can perform repeatable and low-cost signal measurement at high frequencies. In the transition region of the circuit board device, the area of the anti-pad regions of the reference layers at the middle levels directly below the pad is larger than the area of the anti-pad region of the top reference layer surrounding the pad in the plan view. In the anti-pad regions at the middle levels, the dimension (the dimension DS) in the direction substantially parallel to the extending direction of the transmission line (the direction D1) is smaller than the dimension (the dimension DL) in the direction substantially perpendicular to the extending direction of the transmission line (the direction D3). In some embodiments, the shape of the anti-pad regions of the reference layers at the middle levels in the plan view may be designed to have a capsule-shape, and the transition region may have the optimization range of the geometric parameters such as the length (the length X) and the width (the width W1) of the compensation segment of the transmission line and the offset distance (the distance $D_{off}$) of the capsule anti-pad regions from the geometric center of the pad in the extension direction of the transmission line (the direction D1) to change the parasitic effect of the transition region. Therefore, the return loss for the transition region due to the impedance mismatch can be reduced in the measurements of high-frequency signals.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A circuit board device, comprising:
   a transition region, comprising:
   a first conductive layer at a first level, comprising:
     a pad used to connect to a solderless connector;
     a transmission line connected to the pad, wherein the transmission line comprises a first segment connected to the pad and a second segment connected to the first segment, wherein the first segment has a first width, the second segment has a second width, and the second width is less than or equal to the first width; and
     a first reference layer, wherein the first reference layer has a first anti-pad region for the pad and the transmission line disposed therein;
   a second conductive layer at a second level, comprising:
     a second reference layer, wherein the second reference layer has a second anti-pad region, wherein in a plan view, a portion of the first anti-pad region surrounding the pad is completely within the second anti-pad region, wherein a geometric center point of the second anti-pad region below the first anti-pad region is offset from a geometric center point of the pad in the plan view, and wherein a first dimension of the second anti-pad region in a first direction is smaller than a second dimension of the second anti-pad region in a second direction; and
   conductive vias vertically disposed between the first conductive layer and the second conductive layer, wherein the conductive vias are connected to the first reference layer and the second reference layer and surround the pad.

2. The circuit board device as claimed in claim 1, wherein the first direction is substantially parallel to an extending direction of the transmission line, and wherein the second direction is substantially perpendicular to the extending direction of the transmission line.

3. The circuit board device as claimed in claim 1, further comprising:
   a substrate, wherein the substrate comprises a core layer and a build-up layer disposed on the core layer, wherein the first conductive layer and the second conductive layer are arranged on a top surface and a bottom surface of the build-up layer.

4. The circuit board device as claimed in claim 1, wherein the conductive vias surround the second anti-pad region in the plan view.

5. The circuit board device as claimed in claim 1, wherein the second reference layer does not overlap the pad at all in the plan view.

6. The circuit board device as claimed in claim 1, wherein the first segment has a first length, and the first length is in a range of 95 μm to 605 μm.

7. The circuit board device as claimed in claim 1, wherein the first segment has a first length, and of the first length is in a range of 325 μm to 605 μm.

8. The circuit board device as claimed in claim 1, wherein the first width is in a range of 145 μm to 215 μm.

9. The circuit board device as claimed in claim 1, wherein the first width is in a range of 165 μm to 195 μm.

10. The circuit board device as claimed in claim 1, wherein a first edge portion of the second anti-pad region located below the transmission line is separated from a geometric center point of the pad by a first distance, and wherein the first distance is in a range of 220 μm to 355 μm.

11. The circuit board device as claimed in claim 1, wherein the pad has a first radius, and the first radius is greater than or equal to 195 μm.

12. The circuit board device as claimed in claim 1, wherein a second edge portion of the first anti-pad region surrounding the pad is separated from a geometric center point of the pad by a second radius, and the second radius is in a range of 445 μm to 455 μm.

13. The circuit board device as claimed in claim 1, wherein the second width is in a range of 125 μm to 135 μm.

14. The circuit board device as claimed in claim 1, wherein the second anti-pad region has a capsule shape, a semicircle shape, a crescent shape or a kidney shape in the plan view.

15. The circuit board device as claimed in claim 14, wherein two arc-shaped ends of the capsule-shaped second anti-pad region along the second direction have a third radius, wherein the third radius is in a range of 395 μm to 405 μm.

16. The circuit board device as claimed in claim 15, wherein a portion of the capsule-shaped second anti-pad region between the arc-shaped ends along the second direction has an extended length, wherein the extended length is in a range of 395 μm to 405 μm.

17. The circuit board device as claimed in claim 10, further comprising:
a third conductive layer at a third level, comprising:
a third reference layer, wherein the third reference layer has a third anti-pad region, wherein in the plan view, the pad and the portion of the first anti-pad region surrounding the pad are completely located within the third anti-pad region.

18. The circuit board device as claimed in claim 17, wherein the third anti-pad region has a capsule shape, a semicircle shape, a crescent shape or a kidney shape in the plan view.

19. The circuit board device as claimed in claim 17, wherein the second anti-pad region completely overlaps the third anti-pad region in the plan view.

20. The circuit board device as claimed in claim 17, wherein a third edge portion of the third reference layer below the transmission line is separated from the geometric center point of the pad by a second distance, and the first distance is equal to the second distance.

* * * * *